(12) United States Patent
Yen

(10) Patent No.: US 10,794,943 B2
(45) Date of Patent: Oct. 6, 2020

(54) CAPACITANCE ADJUSTMENT METHOD AND CAPACITANCE ADJUSTMENT DEVICE

(71) Applicant: RichWave Technology Corp., Taipei (TW)

(72) Inventor: Ren-Hong Yen, Taipei (TW)

(73) Assignee: RichWave Technology Corp., Taipei (TW)

(*) Notice: Subject to any disclaimer, the term of this patent is extended or adjusted under 35 U.S.C. 154(b) by 65 days.

(21) Appl. No.: 16/201,972

(22) Filed: Nov. 27, 2018

(65) Prior Publication Data
US 2019/0265285 A1    Aug. 29, 2019

(30) Foreign Application Priority Data

Feb. 23, 2018    (TW) .............................. 107106144 A

(51) Int. Cl.
*G01R 27/26* (2006.01)
*H03K 17/955* (2006.01)
*G01D 5/24* (2006.01)

(52) U.S. Cl.
CPC ........... *G01R 27/2605* (2013.01); *G01D 5/24* (2013.01); *H03K 17/955* (2013.01)

(58) Field of Classification Search
CPC ................. G01R 27/2605; G01D 5/24; H03H 2210/025; H03H 2210/036; H04B 1/0458; H04B 1/16; G01B 27/2605
See application file for complete search history.

(56) References Cited

U.S. PATENT DOCUMENTS

| | | | |
|---|---|---|---|
| 4,399,426 A * | 8/1983 | Tan | H03M 1/183 341/120 |
| 4,709,225 A | 11/1987 | Welland | |
| 7,170,439 B1 * | 1/2007 | Chen | H03M 1/1009 341/118 |
| 7,924,209 B2 * | 4/2011 | Kuo | H03M 1/1061 341/118 |
| 9,853,655 B1 * | 12/2017 | Pernull | H03M 1/1071 |
| 2010/0201552 A1 * | 8/2010 | Kuo | H03M 1/1061 341/121 |
| 2017/0060342 A1 * | 3/2017 | Tang | G06F 3/044 |

FOREIGN PATENT DOCUMENTS

TW    201031125 A1    8/2010

* cited by examiner

*Primary Examiner* — Dominic E Hawkins
(74) *Attorney, Agent, or Firm* — Winston Hsu

(57) ABSTRACT

A capacitance adjustment method for enabling or disabling a first set of capacitors to an $n_{th}$ set of capacitors of n sets of capacitors, includes generating a base count according to base capacitance, generating a first count to an $n_{th}$ count according to the first set of capacitors to the $n_{th}$ set of capacitors respectively, obtaining a first ratio to an $n_{th}$ ratio according to the base count and the first count to the $n_{th}$ count, indicating a target count, obtaining a target ratio according to the base count and the target count, and obtaining a first control signal to an $n_{th}$ control signal according to the target ratio and the first ratio to the $n_{th}$ ratio so as to enable or disable the first set of capacitors to the $n_{th}$ set of capacitors accordingly.

19 Claims, 9 Drawing Sheets

US 10,794,943 B2

CAPACITANCE ADJUSTMENT METHOD AND CAPACITANCE ADJUSTMENT DEVICE

CROSS REFERENCE TO RELATED APPLICATION

This application claims priority to Taiwan Patent Application No. 107106144, filed Feb. 23, 2018, and incorporated herein by reference in its entirety.

TECHNICAL FIELD

The disclosure is related to a capacitance adjustment method and a capacitance adjustment device, and more particularly, a capacitance adjustment method and a capacitance adjustment device used for calibrating and matching capacitance according to capacitance and a count.

BACKGROUND

In the field of antenna application, a capacitor in an antenna transceiving device has to be adjusted for operating within a correct frequency range. For example, an adjustable capacitor coupled in an amplitude modulation (AM) antenna has to be adjusted according to a target frequency for correct matching. According to a current technique, a capacitor may be continuously adjusted while an oscillation frequency is continuously measured until the oscillation frequency meets a target frequency. According to another technique, a highest frequency, a lowest frequency and corresponding oscillation frequencies can be measured, then capacitance corresponding to a target frequency can be calculated using interpolation for adjusting a capacitor. However, the abovementioned techniques both have some shortcomings. Continuously adjusting a capacitor and measuring a frequency will lead to excessive numbers of times of adjustment and measurement, so it is difficult to reduce workload. Using interpolation will lead to poor matching effects of components after a circuit is actually manufactured. In other words, capacitance obtained using interpolation often fails to match a target frequency. Hence, there is still a need for a more appropriate solution to deal with engineering challenges of capacitance adjustment in the field.

SUMMARY

An embodiment provides a capacitance adjustment method used to enable or disable a first set of capacitors to an $n_{th}$ set of capacitors of n sets of capacitors, wherein n is a positive integer larger than zero. The capacitance adjustment method comprises generating a base count according to base capacitance; generating a first count to an $n_{th}$ count according to the first set of capacitors to the $n_{th}$ set of capacitors respectively; obtaining a first ratio to an $n_{th}$ ratio according to the base count and the first count to the $n_{th}$ count; indicating a target count; obtaining a target ratio according to the base count and the target count; and obtaining a first control signal to an $n_{th}$ control signal according to the target ratio and the first ratio to the $n_{th}$ ratio to enable or disable the first set of capacitors to the $n_{th}$ set of capacitors accordingly.

An embodiment provides a capacitance adjustment device comprising a controllable capacitance array, a count generation circuit and a processing unit. The controllable capacitance array is configured to generate equivalent capacitance according to a set of control signals. The controllable capacitance array comprises a set of control terminals configured to receive the set of control signals, and a first terminal. The count generation circuit is configured to generate a count according to the equivalent capacitance of the controllable capacitance array. The count generation circuit comprises an input terminal coupled to the first terminal of the controllable capacitance array, and at least one output terminal configured to output the count. The processing unit is configured to generate the set of control signals according to the count. The processing unit comprises at least one input terminal coupled to the at least one output terminal of the count generation circuit and configured to receive the count, and a set of output terminals coupled to the set of control terminals and configured to output the set of control signals.

DETAILED DESCRIPTION

Figure 1:
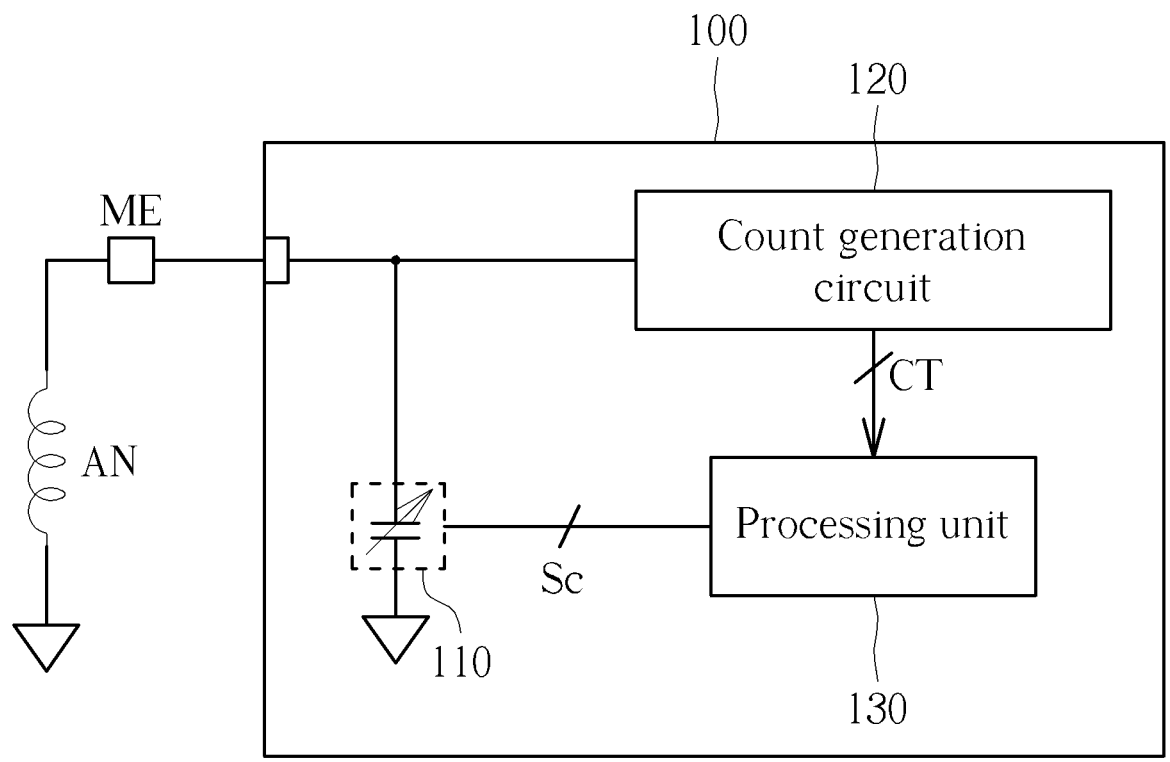
FIG. 1 illustrates a capacitance adjustment device according to an embodiment.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 illustrates a capacitance adjustment device 100 according to an embodiment. As shown in FIG. 1, the capacitance adjustment device 100 may be coupled to an antenna AN via a matching component ME. For example, the antenna AN may be an amplitude modulation antenna, and the matching component ME may include at least one passive component such as a capacitor, a resistor or a circuit of a combination thereof. The capacitance adjustment device 100 may include a controllable capacitance array 110, a count generation circuit 120 and a processing unit 130. The capacitance adjustment device 100 may adjust capacitance of the controllable capacitance array 110 for matching an operating frequency of the antenna AN.

The controllable capacitance array 110 may be used to generate equivalent capacitance according to a set of control signals Sc. The controllable capacitance array 110 may include a first terminal and a set of control terminals, where the set of control terminals is used to receive the set of control signals Sc.

The count generation circuit 120 may be used to generate a count CT according to the equivalent capacitance of the controllable capacitance array 110. The count generation circuit 120 may include an input terminal and at least one output terminal, where the input terminal may be coupled to the first terminal of the controllable capacitance array 110, and the at least one output terminal may be used to output the count CT.

The processing unit 130 may be used to generate the set of control signals Sc according to the count CT. The processing unit 130 may include at least one input terminal and a set of output terminals, where the at least one input terminal may be coupled to the at least one output terminal of the count generation circuit 120 and used to receive the count CT, and the set of output terminals may be coupled to the set of control terminals of the controllable capacitance array 110 and used to output the set of control signals Sc.

Figure 2:
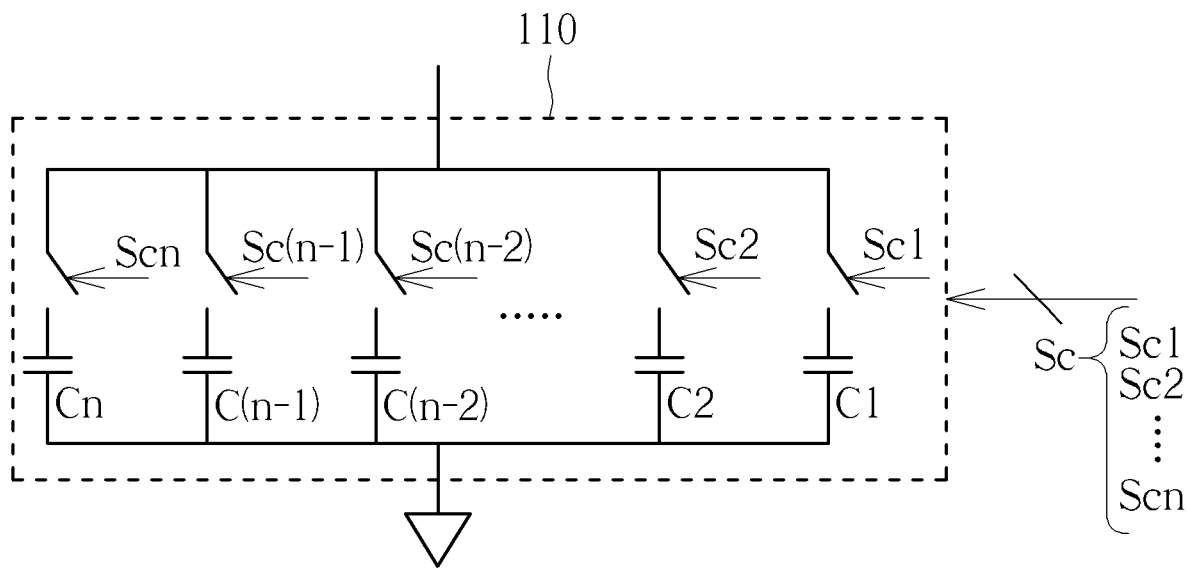
FIG. 2 illustrates the controllable capacitance array in FIG. 1 according to an embodiment.

FIG. 2 illustrates the controllable capacitance array 110 of FIG. 1 according to an embodiment. The controllable capacitance array 110 may include a first set of capacitors C1 (which may be regarded as an equivalent capacitor C1) to an $n_{th}$ set of capacitors Cn (which may be regarded as an equivalent capacitor Cn). For simplifying description, in the following, the first set of capacitors C1 may be expressed as the (equivalent) capacitor C1, a second set of capacitors C2 may be expressed as an (equivalent) capacitor C2, the $n_{th}$ set of capacitors Cn may be expressed as an (equivalent) capacitor Cn, and so on. In FIG. 2, each set of capacitors may be expressed by one capacitor. However, each set of capacitors may be formed by multiple capacitors, for example, by multiple capacitors which are connected in parallel. The capacitors C1 to Cn may be connected in parallel through switches. For example, the capacitor C1 may be controlled through a first switch, the capacitor C2 may be controlled through a second switch, and so on. The switch coupled to the capacitor C1 may be controlled by a control signal Sc1, the switch coupled to the capacitor C2 may be controlled by a control signal Sc2, and so on. When a corresponding switch is enabled to be conductive, a corresponding capacitor may be enabled. When a corresponding switch is disabled to be not conductive, a corresponding capacitor may be enabled. The set of control signals Sc may include n control signals including a first control signal Sc1 to an $n_{th}$ control signal Scn. In another example, the set of control signals Sc may be an n-bit signal where a first bit is expressed as Sc1, an $n_{th}$ bit may be expressed as Scn, and so on. The mentioned n may be a positive integer larger than one. For example, the control signals Sc1 and Scn may respectively correspond to a least significant bit (LSB) and a most significant bit (MSB) of the control signal Sc. In the above, 1 may be used as a minimum sequence number of the signals Sc1 to Scn of the set of control signals Sc for convenience of description. However, in the field, 0 may be sometimes used as a minimum sequence number. For example, an n-bit signal may be expressed as Sn[(n−1):0] where a bit of the minimum sequence number (i.e. least significant bit) may be expressed as Sc[0]. These kind of reasonable changes of expression related to engineering applications are still within the scope of embodiments.

In the capacitors C1 to Cn, a capacitor may be enabled when a corresponding switch is enabled, and a capacitor may be disabled when a corresponding switch is disabled. By controlling the switches using the control signals Sc1 to Scn, a portion of the capacitors C1 to Cn may be selected and electrically connected in parallel for controlling capacitance provided by the controllable capacitance array 110.

FIG. 2 may be a simplified schematic, and further details of circuitry of the controllable capacitance array 110 may be reasonably adjusted in practice. In FIG. 2, the capacitors C1 to Cn may respectively have smallest capacitance to largest capacitance to respectively correspond to a highest frequency to a lowest frequency.

Figure 3:
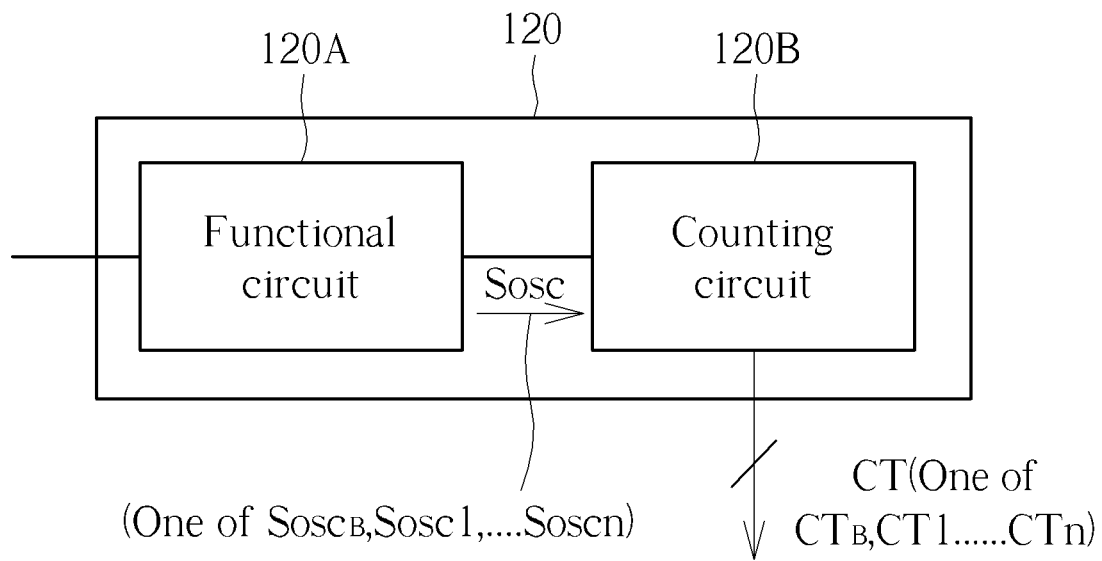
FIG. 3 illustrates the count generation circuit in FIG. 1 according to an embodiment.

FIG. 3 illustrates the count generation circuit 120 of FIG. 1 according to an embodiment. The count generation circuit 120 may include a functional circuit 120A and a counting circuit 120B. The functional circuit may be used to generate a count signal Sosc and include an input terminal and an output terminal, where the input terminal is coupled to the input terminal of the count generation circuit 120 and the output terminal may be used to output the count signal Sosc. The counting circuit 120B may be used to generate the count CT and include an input terminal and at least one output terminal, where the input terminal may be coupled to the output terminal of the functional circuit 120A for receiving the count signal Sosc, and the at least one output terminal may be correspondingly coupled to the at least one output terminal of the count generation circuit 120 for outputting the count CT.

Figure 4:
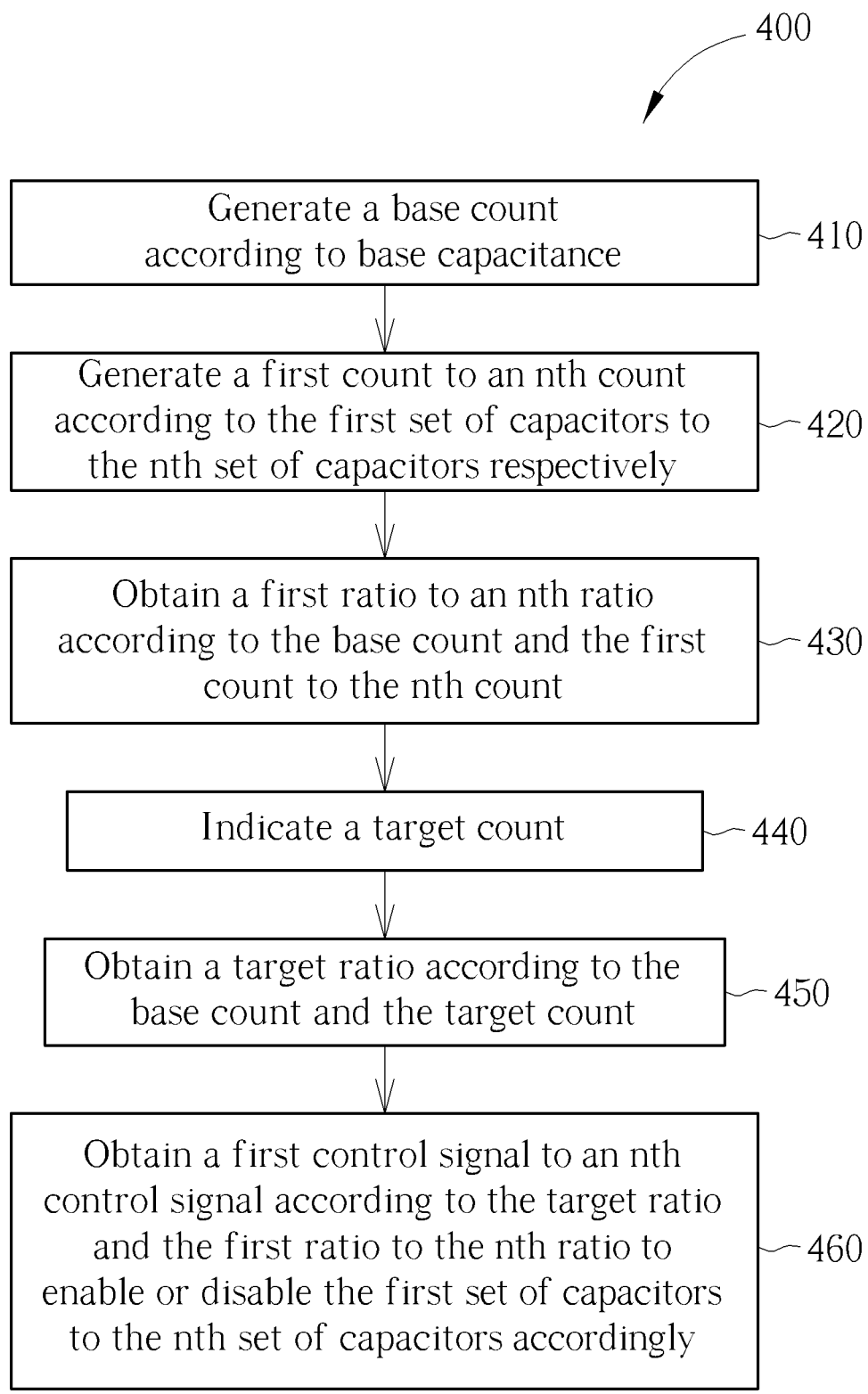
FIG. 4 illustrates a flowchart of a capacitance adjustment method according to an embodiment.

FIG. 4 illustrates a flowchart of a capacitance adjustment method 400 according to an embodiment. As shown in FIG. 1 to FIG. 4, the capacitance adjustment method 400 may be used to enable or disable a first set of capacitors C1 to an $n_{th}$ set of capacitors C2 of n sets of capacitors Cn. The capacitance adjustment method 400 may include the following steps.

Step 410: generate a base count $CT_B$ according to base capacitance $C_B$;

Step 420: generate a first count CT1 to an $n_{th}$ count CTn according to the first set of capacitors C1 to the $n_{th}$ set of capacitors Cn respectively;

Step 430: obtain a first ratio R1 to an $n_{th}$ ratio Rn according to the base count $CT_B$ and the first count CT1 to the $n_{th}$ count CTn;

Step 440: indicate a target count $CT_{TAR}$;

Step 450: obtain a target ratio $R_{TAR}$ according to the base count $CT_B$ and the target count $CT_{TAR}$; and Step 460: obtain a first control signal Sc1 to an $n_{th}$ control signal Scn according to the target ratio $R_{TAR}$ and the first ratio R1 to the $n_{th}$ ratio Rn to enable or disable the first set of capacitors C1 to the $n_{th}$ set of capacitors Cn accordingly.

The abovementioned Step 410, Step 420 and Step 430 may be calibration steps performed by calculating the ratios of capacitances for reducing influences caused by errors of circuitry layout and/or manufacture process. The abovementioned Step 440, Step 450 and Step 460 may be matching steps performed for adjusting the capacitance of the controllable capacitance array 110. The setting of the adjusted controllable capacitance array 110 may be used in subsequent manufacture process, for example, a mass production process. In the example of FIG. 1, Steps 410 and 420 may be performed using the count generation circuit 120. Steps 430 to 460 may be performed using the processing unit 130 for calculation and obtaining the control signals.

In Step 410, the base capacitance $C_B$ may correspond to minimum capacitance of the controllable capacitance array 110, for example, parasitic capacitance when the n sets of capacitors C1 to Cn are all disabled. Step 410 may be performed by generating a base count signal $Sosc_B$ according to the base capacitance $C_B$, and generating the base count $CT_B$ according to the base count signal $Sosc_B$.

Step 420 may be performed by enabling the first set of capacitors C1 to the $n_{th}$ set of capacitors Cn respectively to generate a first count signal Sosc1 to an $n_{th}$ count signal Soscn, and generating the first count CT1 to the $n_{th}$ count CTn according to the first count signal CT1 to the $n_{th}$ count signal CTn respectively. According to an embodiment, in Step 430, the first ratio R1 may be expresses as R1=$(CT_B/CT1)^2-1$, and the $n_{th}$ ratio Rn may be expressed as Rn=$(CT_B/CTn)^2-1$.

In Step 440 and Step 450, the target ratio $R_{TAR}$ may be determined according to an operation frequency of a channel to be used. In Step 440, the target count $CT_{TAR}$ may be indicated according to an application. In Step 450, the target ratio $R_{TAR}$ may be expressed as $R_{TAR}=(CT_B/CT_{TAR})$ 2-1, where the target count $CT_{TAR}$ may be a value determined according to a channel to be used.

As described above, under different conditions, the count signal Sosc in FIG. 3 may be one of the base count signal $Sosc_B$ and the count signals Sosc1 to Soscn described above. In addition, under different conditions, the count CT in FIG. 3 may be one of the base count $CT_B$ and the counts CT1 to CTn described above.

Figure 5:
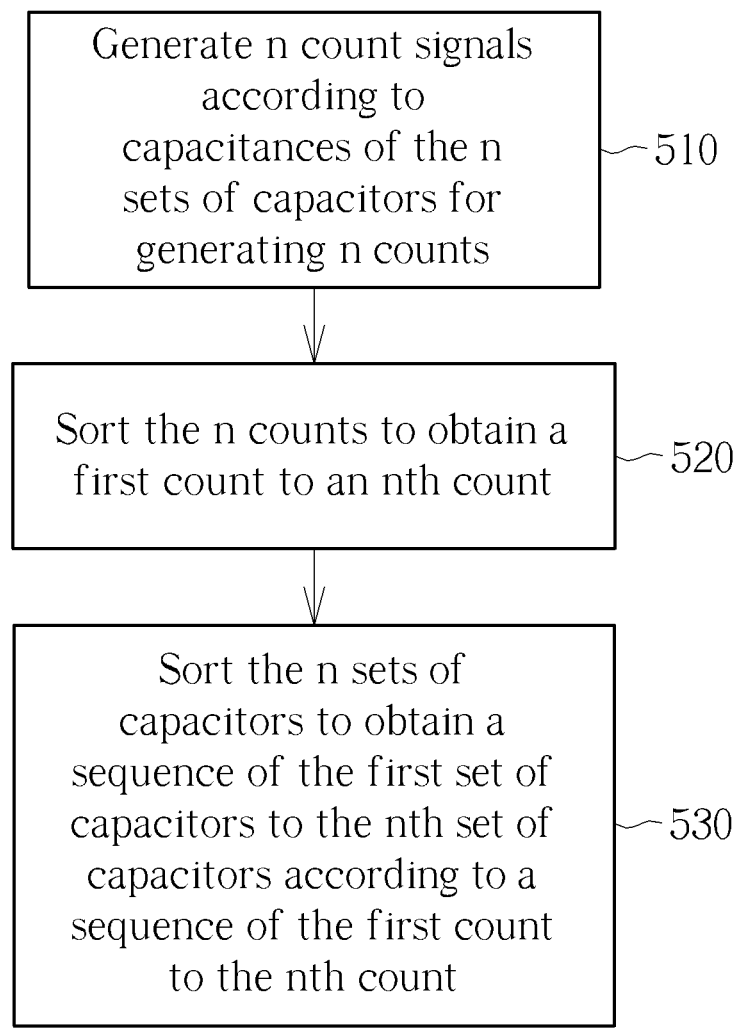
FIG. 5 illustrates a flowchart of sorting capacitors according to an embodiment.

For performing subsequent steps, the capacitors Cn to C1 in Step 420 and FIG. 2 may be sorted according to capacitance instead of being sorted by position or randomly. In other words, the capacitors Cn to C1 are sorted according to the capacitance of the capacitors Cn to C1 so as to obtain sequence numbers of the capacitors Cn to C1. Hence, a flow of FIG. 5 may be performed. FIG. 5 illustrates a flowchart of sorting the capacitors C1 to Cn according to an embodiment. The flow of FIG. 5 may include following steps.

Step 510: generate n count signals according to capacitances of the n sets of capacitors for generating n counts;

Step 520: sort the n counts to obtain a first count CT1 to an $n_{th}$ count CTn; and Step 530: sort the n sets of capacitors to obtain a sequence of the first set of capacitors C1 to the $n_{th}$ set of capacitors Cn according to a sequence of the first count CT1 to the $n_{th}$ count CTn.

For example, the flow of FIG. 5 may be performed before or after Step 410. The capacitance of the first set of capacitors C1 to the $n_{th}$ set of capacitors Cn may be sequentially increased. In other words, in the n sets of capacitors C1 to Cn, capacitance of an $i_{th}$ set of capacitors may be smaller than capacitance of an $(i+1)_{th}$ set of capacitors, n>i>0, and i is an integer. In Step 510, for example, the n sets of capacitors may include C1 to Cn shown in FIG. 2. However, in the phase of Step 510, it is merely known there are n sets of capacitors, but the n sets of capacitors are not sorted. Likewise, the n count signals in Step 510 may include the abovementioned count signals Sosc1 to Soscn without being sorted yet, and the n counts in Step 510 may include the abovementioned counts CT1 to CTn without being sorted yet. After performing Steps 520 and 530, each set of capacitors may be sorted and assigned with a sequence number. For example, the set of capacitors with smallest capacitance may be C1, the set of capacitors with second smallest capacitance may be C2, and so on. Table 1 may be referred to for easier description.

TABLE 1

| The $n_{th}$ set of capacitors Cn | ... | The first set of capacitors C1 |
|---|---|---|
| With maximum capacitance | ... | With minimum capacitance |
| Corresponding to the $n_{th}$ count signal Soscn | ... | Corresponding to the first count signal Sosc1 |
| Corresponding to a lowest frequency | ... | Corresponding to a highest frequency |
| Corresponding to the smallest count CTn | ... | Corresponding to the largest count CT1 |

TABLE 1-continued

| Being enabled or disabled through a switch which is controlled by the $n_{th}$ control signal Scn of the control signals Sc | ... | Being enabled or disabled through a switch which is controlled by the first control signal Sc1 of the control signals Sc |
|---|---|---|

As described above, the sequence number corresponding to a first set of capacitors or a first signal may be 1, but sometimes a first set of capacitors or a first signal may be assigned a sequence number 0. In addition, the sequence of the sequence numbers may be reasonably adjusted. For example, n sets of capacitors may be assigned sequence numbers according to capacitances from small to large. The n sets of capacitors may be assigned numbers according to capacitances from large to small, and related steps described above may be correspondingly adjusted. Such reasonable changes are still within the scope of embodiments.

Figure 6:
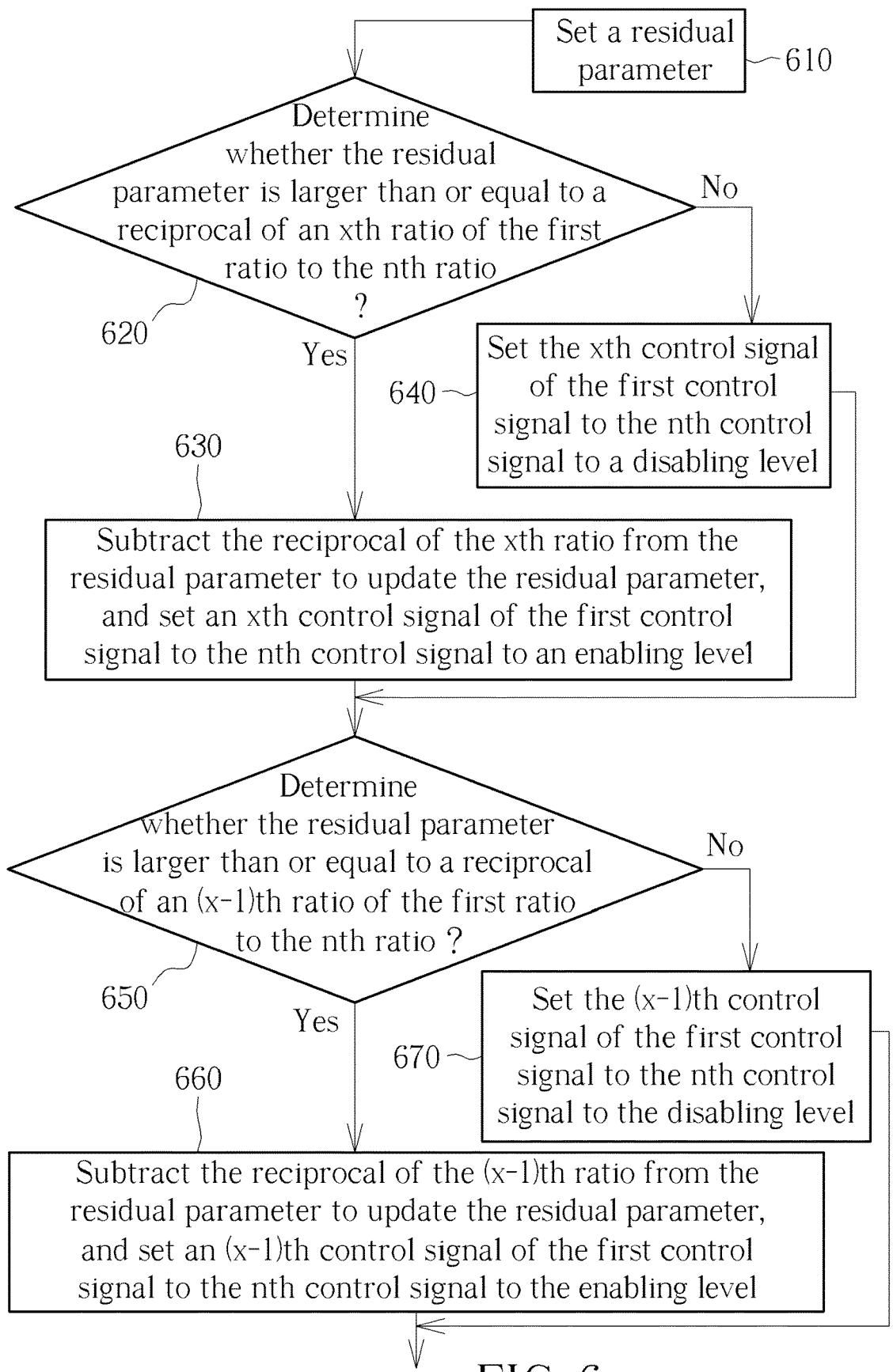
FIG. 6 illustrates a flowchart of steps included by a step shown in FIG. 4 according to an embodiment.

FIG. 6 illustrates a flowchart of steps included by Step 460 shown in FIG. 4 according to an embodiment. Step 460 may include the following steps.

Step 610: set a residual parameter Rr;

Step 620: determine whether the residual parameter Rr is larger than or equal to a reciprocal of an $x_{th}$ ratio 1/Rx of the first ratio R1 to the $n_{th}$ ratio Rn; if so, enter Step 630; else, enter Step 640;

Step 630: subtract the reciprocal of the $x_{th}$ ratio 1/Rx from the residual parameter Rr to update the residual parameter Rr, and set an $x_{th}$ control signal Scx of the first control signal Sc1 to the $n_{th}$ control signal Scn to an enabling level; enter Step 650;

Step 640: set the $x_{th}$ control signal Scx of the first control signal Sc1 to the $n_{th}$ control signal Scn to a disabling level; enter Step 650;

Step 650: determine whether the residual parameter Rr is larger than or equal to a reciprocal of an $(x-1)_{th}$ ratio 1/R(x-1) of the first ratio R1 to the $n_{th}$ ratio Rn; if so, enter Step 660; else enter Step 670;

Step 660: subtract the reciprocal of the $(x-1)_{th}$ ratio 1/R(x-1) from the residual parameter Rr to update the residual parameter Rr, and set an $(x-1)_{th}$ control signal Sc(x-1) of the first control signal Sc1 to the $n_{th}$ control signal Scn to the enabling level.

Step 670: set the $(x-1)_{th}$ control signal Sc(x-1) of the first control signal Sc1 to the $n_{th}$ control signal Scn to the disabling level.

In FIG. 6, an initial value of the residual parameter Rr described in Step 610 may be equal to a reciprocal of the target ratio $1/R_{TAR}$, and may be expressed as $Rr=1/R_{TAR}=1/((CT_B/CT_{TAR})^2-1)$, where x may be an integer, and n≥x≥2.

In FIG. 6, algebraic expressions are used to describe the steps. In Step 620, it may be determined whether Rr is larger than or equal to 1/Rx. In Step 630, Rr may be replaced with [Rr-(1/Rx)]. In practice, the steps in FIG. 6 may be repeatedly performed. For example, when the control signal Sc includes 10 bits, the parameter n may be 10 (i.e. n=10), and the control signal Sc may include signals Sc10 to Sc1. When initially entering Step 460, the parameter x may be 10, a $10_{th}$ control signal Sc10 may be set in Step 630 and Step 640, the mentioned (x-1) may be 9 in Step 650, a $9_{th}$ control signal Sc9 may be set in Step 660 and Step 670. After performing Steps 660 and 670, the flow of FIG. 6 may be repeatedly performed from Step 610, but the parameter x may be adjusted to be 8, and so on. Similar operations may be performed until the signals Sc10 to Sc1 included by the control signal Sc are respectively set to an enabling level or a disabling level, and the flow of FIG. 6 may be completed. The mentioned enabling level in FIG. 6 may be a high level or corresponding to a 1-bit 1, and the mentioned disabling level in FIG. 6 may be a low level or corresponding to a 1-bit 0.

Figure 7:
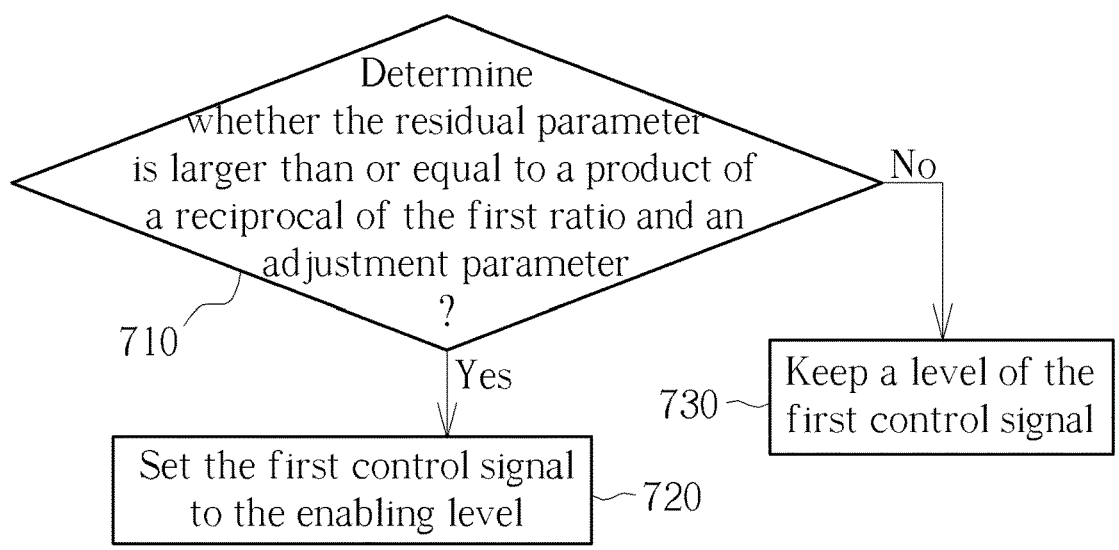
FIG. 7 illustrates a flowchart of steps further included by the step shown in FIG. 4 according to an embodiment.

FIG. 7 illustrates a flowchart of steps further included by Step 460 shown in FIG. 4 according to an embodiment. The steps in FIG. 7 may be performed after the steps in FIG. 6 are repeatedly performed until the control signals of all bits of the control signal Sc are set. The following steps are shown in FIG. 7.

Step 710: determine whether the residual parameter Rr is larger than or equal to a product of a reciprocal of the first ratio R1 1/R1 and an adjustment parameter Ap; if so, enter Step 720; else enter Step 730;

Step 720: set the first control signal Sc1 to the enabling level.

Step 730: keep a level of the first control signal Sc1.

The steps in FIG. 7 may be used to fine tune the control signal Sc, for example, by changing a least significant bit of the control signal Sc. Step 710 may be used to check if Rr≥Ap×(1/R1). The adjustment parameter Ap may be set according to engineering measurement and an experience value. For example, the adjustment parameter Ap may be 0.5. The steps of FIG. 7 may be optionally used.

Figure 8:
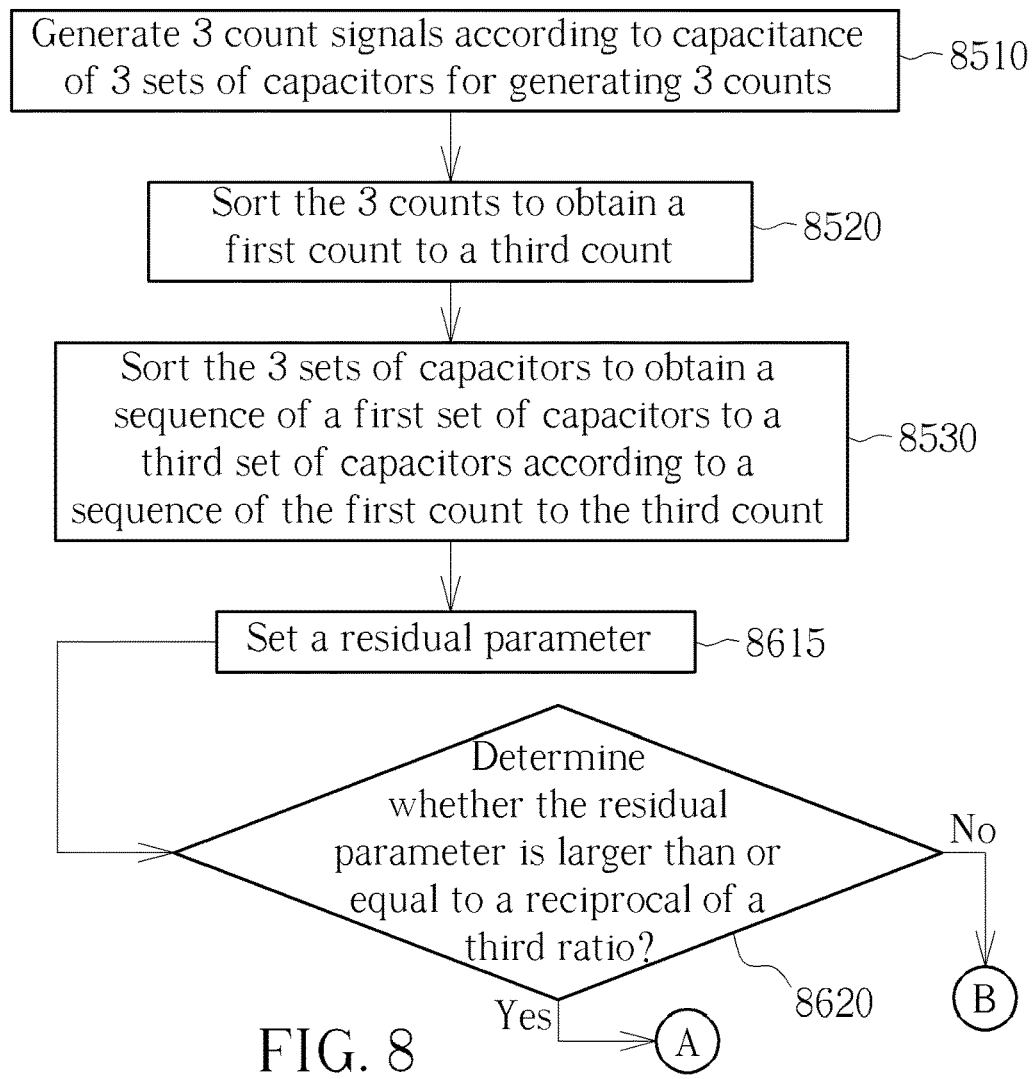
FIG. 8 to FIG. 10 illustrate a flowchart of performing the steps of FIG. 5 to FIG. 7 when n=3 according to an embodiment.
Figure 9:
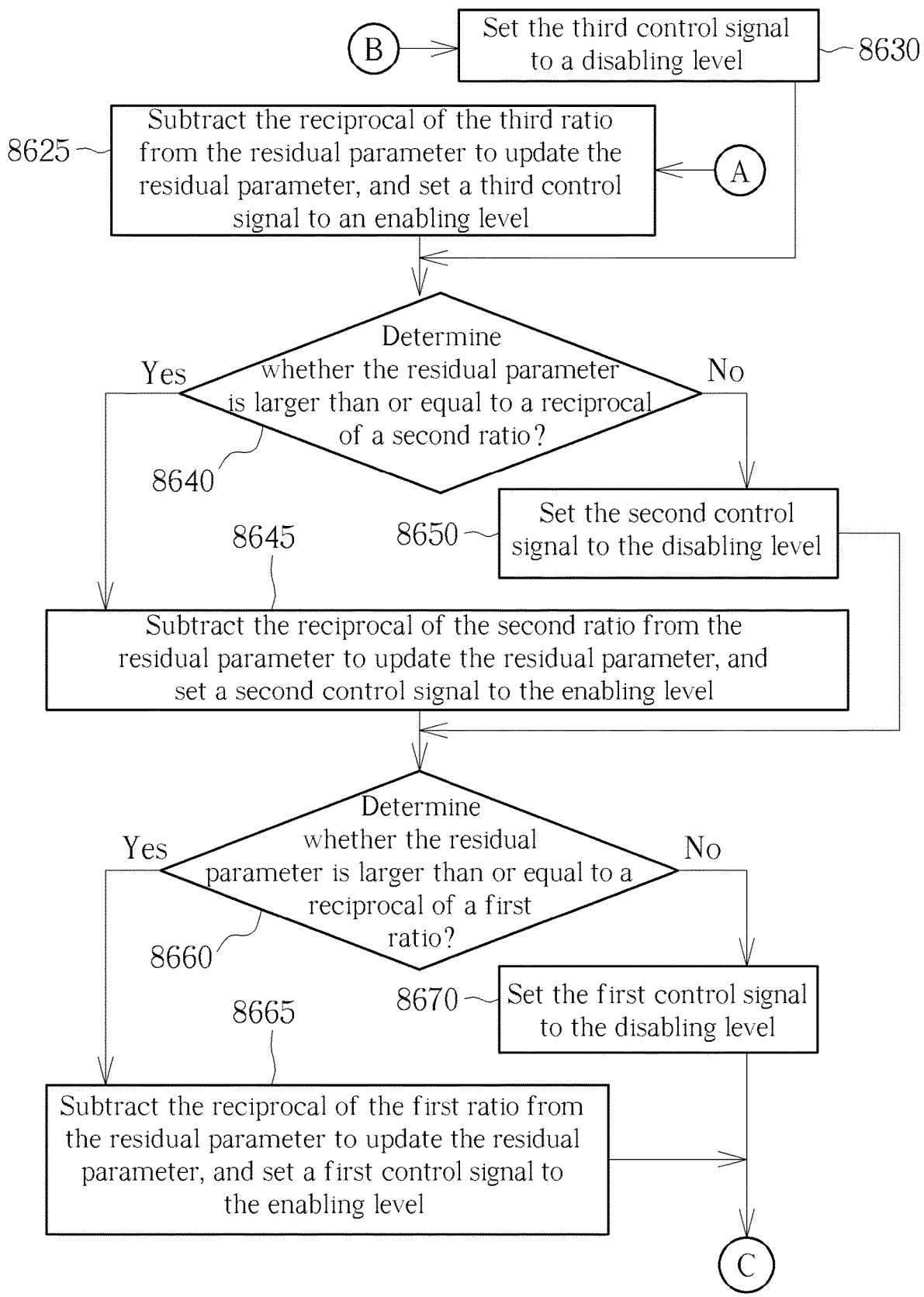
Figure 10:
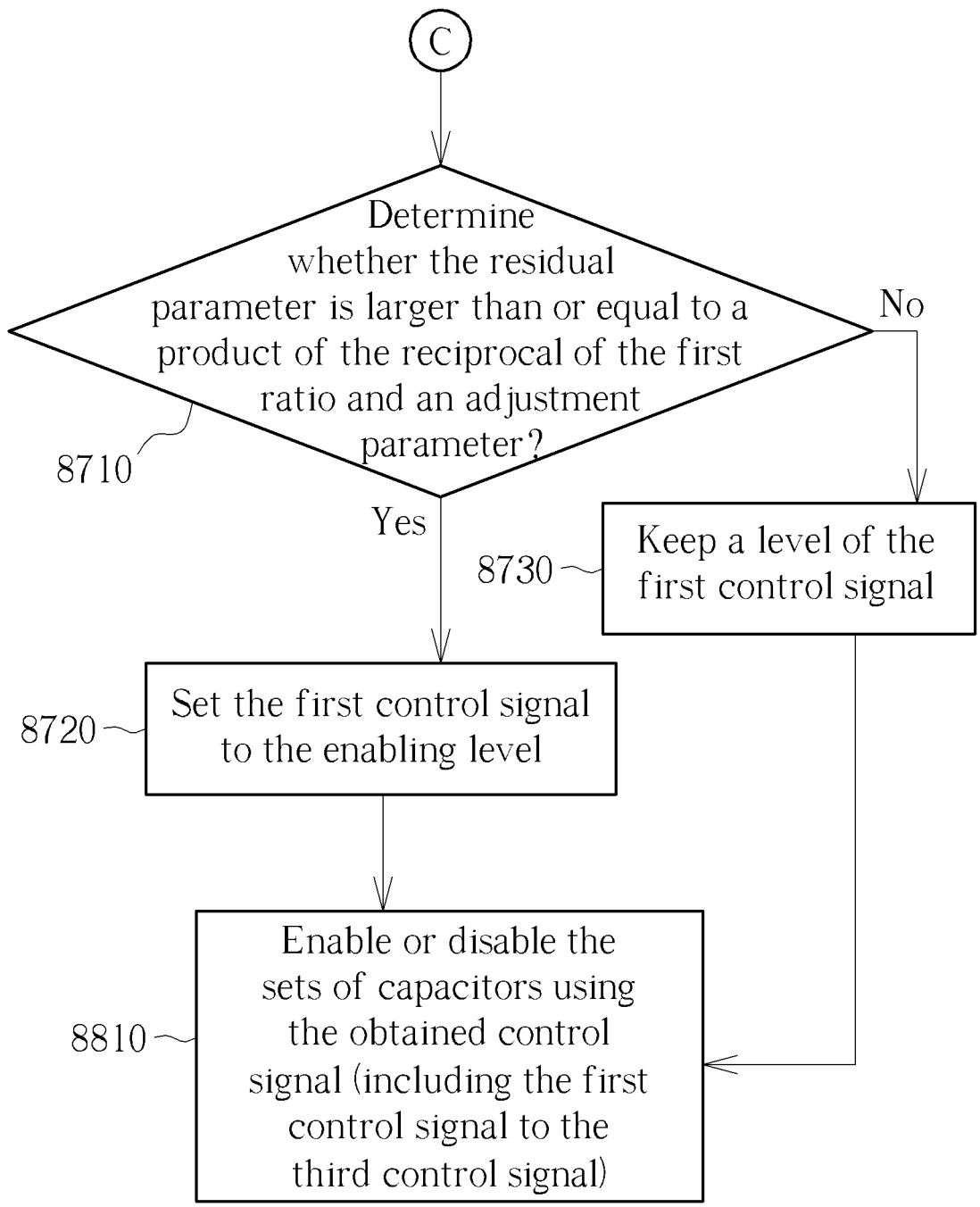

In FIG. 5 to FIG. 7, a variable n is used as an example. For convenience of explanation, n=3 may be used for an example below. FIG. 8 to FIG. 10 illustrate a flowchart of performing the steps of FIG. 5 to FIG. 7 when n=3 according to an embodiment. FIG. 8 to FIG. 10 may include following steps.

Step 8510: generate 3 count signals according to capacitance of 3 sets of capacitors for generating 3 counts;

Step 8520: sort the 3 counts to obtain a first count CT1 to a third count CT3;

Step 8530: sort the 3 sets of capacitors to obtain a sequence of a first set of capacitors C1 to a third set of capacitors C3 according to a sequence of the first count CT1 to the third count CT3;

Step 8615: set a residual parameter Rr; enter Step 8620;

Step 8620: determine whether the residual parameter Rr is larger than or equal to a reciprocal of a third ratio 1/R3; if so, enter Step 8625; else enter Step 8630;

Step 8625: subtract the reciprocal of the third ratio 1/R3 from the residual parameter Rr to update the residual parameter Rr, and set a third control signal Sc3 to an enabling level; enter Step 8640;

Step 8630: set the third control signal Sc3 to a disabling level; enter Step 8640;

Step 8640: determine whether the residual parameter Rr is larger than or equal to a reciprocal of a second ratio 1/R2; if so, enter Step 8645; else, enter Step 8650;

Step 8645: subtract the reciprocal of the second ratio 1/R2 from the residual parameter Rr to update the residual parameter Rr, and set a second control signal Sc2 to the enabling level; enter Step 8660;

Step 8650: set the second control signal Sc2 to the disabling level;

Step 8660: determine whether the residual parameter Rr is larger than or equal to a reciprocal of a first ratio 1/R1; if so, enter Step 8665; else enter Step 8670;

Step 8665: subtract the reciprocal of the first ratio 1/R1 from the residual parameter Rr to update the residual parameter Rr, and set a first control signal Sc1 to the enabling level; enter Step 8710;

Step 8670: set the first control signal Sc1 to the disabling level; enter Step 8710;

Step 8710: determine whether the residual parameter Rr is larger than or equal to a product of the reciprocal of the first ratio 1/R1 and an adjustment parameter Ap; if so, enter Step 8720; else enter Step 8730;

Step 8720: set the first control signal Sc1 to the enabling level; enter Step 8810;

Step 8730: keep a level of the first control signal Sc1; and

Step 8810: enable or disable the sets of capacitors C1 to C3 using the obtained control signal Sc (including Sc3, Sc2 and Sc1).

Steps 8510, 8520 and 8530 above may correspond to FIG. 5. Steps 8615 to 8670 may correspond to the steps in FIG. 6 which may be repeatedly performed. Steps 8710 to 8730 may correspond to the steps in FIG. 7. Step 8810 may include controlling switches respectively coupled to the sets of capacitors C1 to C3 using the set of control signals Sc to enable or disable the capacitors. FIG. 8 to FIG. 10 may correspond to an example of FIG. 2 where n=3 and there are three sets of capacitors C1 to C3. However, in practice, n is not limited to three, and n may be another positive integer larger than 1 such as 10. When n is larger, the combinations of enabling and/or disabling multiple sets of capacitors may be also larger, allowing more levels of adjustment.

Figure 11:
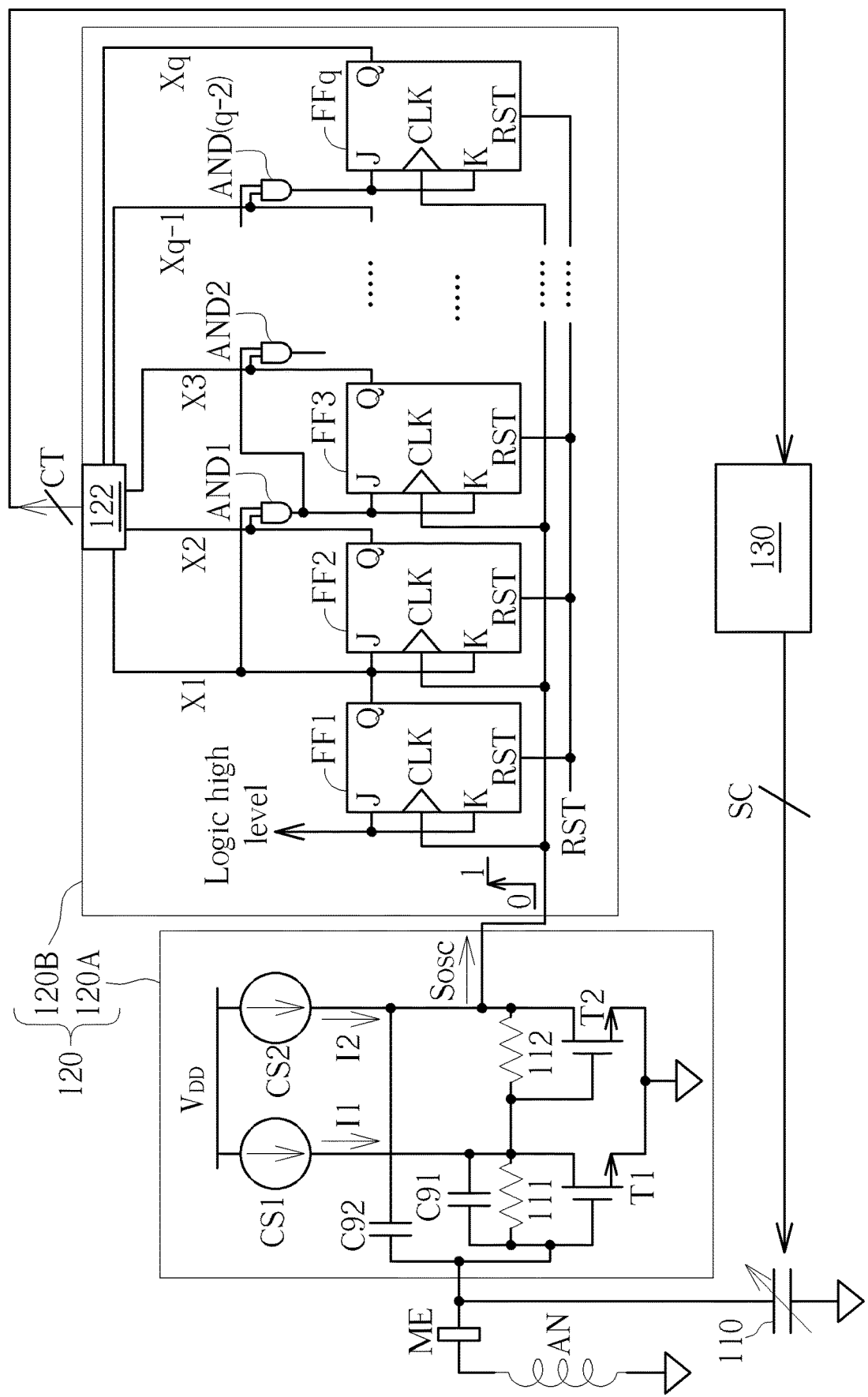
FIG. 11 illustrates a circuit schematic of the capacitance adjustment device with further details of FIG. 3 according an embodiment.

FIG. 11 illustrates a circuit schematic of the capacitance adjustment device 100 with further details of FIG. 3 according an embodiment. As shown in FIG. 3, the count generation circuit 120 may include the functional circuit 120A and the counting circuit 120B. As shown in FIG. 11, the functional circuit 120A of the count generation circuit 120 may include transistors T1 and T2, resistors 111 and 112, capacitors C91 and C92, and current sources CS1 and CS2. The transistor T1 may include a first terminal, a control terminal coupled to the input terminal of the functional circuit 120A, and a second terminal coupled to a reference terminal such as a ground terminal. The transistor T2 may include a first terminal coupled to the output terminal of the functional circuit 120A, a control terminal coupled to the first terminal of the transistor T1, and a second terminal coupled to the reference terminal. The resistor 111 may include a first terminal coupled to the control terminal of the transistor T1, and a second terminal coupled to the first terminal of the transistor T1. The resistor 112 may include a first terminal coupled to the control terminal of the transistor T2, and a second terminal coupled to the first terminal of the transistor T2. The capacitor C91 may include a first terminal coupled to the control terminal of the transistor T1, and a second terminal coupled to the first terminal of the transistor T1. The capacitor C92 may include a first terminal coupled to the control terminal of the transistor T1, and a second terminal coupled to the second terminal of the resistor 112. According to an embodiment, the capacitor C91 may be used for Miller effect. The current source CS1 may be coupled to the first terminal of the transistor T1 for providing a current I1. The current source CS2 may be coupled to the first terminal of the transistor T2 for providing a current I2. The current sources CS1 and CS2 may be coupled to a reference voltage terminal $V_{DD}$ (e.g. a high voltage terminal). The output terminal of the functional circuit 120A may output the count signal Sosc. According to an embodiment, the first terminal of the transistor T1 or T2 is drain, the second terminal of the transistor T1 or T2 is source, and the control terminal of the transistor T1 or T2 is gate.

As shown in FIG. 11, the counting circuit 120B may include q flip-flops FF1 to FFq, and (q−2) AND-gates AND1 to AND(q−2). According to an embodiment, the output terminal of the counting circuit 120B may include one output terminal, and the counting circuit 120B may further include a parallel to serial circuit 112. As shown in FIG. 11, q output terminals X1 to Xq may be coupled to input terminals of the parallel to serial circuit 112, and an output terminal of the parallel to serial circuit 112 may be correspondingly coupled to the output terminal of the counting circuit 120B for outputting the count CT to an input terminal of the processing unit 130. According to another embodiment, the output terminals of the counting circuit 120B may be a set of output terminals including the q output terminals X1 to Xq, and the output terminals of the counting circuit 120B may be correspondingly coupled to a set of output terminals of the count generation circuit 120. The set of output terminals of the count generation circuit 120 may output, for example, q-bit binary data to a set of input terminals of the processing unit 130 correspondingly. Regarding the first flip-flop FF1, a clock terminal may be coupled to the input terminal of the counting circuit 120B for receiving the count signal Sosc, a set of control terminals may be coupled to a logic level such as a logic high level, and an output terminal may be coupled to the first output terminal X1 of the output signals of the counting circuit 120B. Regarding the second flip-flop FF2, a clock terminal may be coupled to the input terminal of the counting circuit 120B, a set of control terminals may be coupled to the output terminal of the first flip-flop FF1, and an output terminal may be coupled to a second output terminal X2 of the output signals of the counting circuit 120B. Regarding an $h_{th}$ flip-flop FFh, a clock terminal may be coupled to the input terminal of the counting circuit 120B, a set of control terminals may be coupled to an output terminal of an (h−2)th AND-gate AND (h−2), and an output terminal may be coupled to an $h_{th}$ output terminal Xh of the output signals of the counting circuit 120B. Regarding the first AND-gate AND1, a first terminal may be coupled to the output terminal of the first flip-flop FF1, a second terminal may be coupled to the output terminal of the second flip-flop FF2, and an output terminal may be coupled to a set of control terminals of the third flip-flop FF3.

Regarding a $P_{th}$ AND-gate ANDp, a first terminal may be coupled to an output terminal of a $(p-1)_{th}$ AND-gate AND (p−1), a second terminal may be coupled to an output terminal of a $(p+1)_{th}$ flip-flop FF(p+1), and an output terminal may be coupled to a set of control terminals of a (p+2) flip-flop FF(p+2). The parameters p, h and q may be positive integers, 2<h<(q+1), and 1<p<(q−1). Algebraic expressions are used to describe the coupling of the components shown in FIG. 11, and the parameter q may be adjusted to adjust the bit count of the output terminals of the counting circuit 120B. As shown in FIG. 11, regarding a flip-flop, a clock terminal may be denoted as CLK, an output terminal may be denoted as Q, and a flip-flop may further include a reset terminal RST to receive a rest signal for being reset. According to an embodiment, each flip-flop shown in FIG. 11 may be a J-K flip-flop, so a set of control terminals of each flip-flop may include a J terminal and a K terminal. However, FIG. 11 merely provides an example for showing a structure of the functional circuit 120A and the counting circuit 120B instead of limiting the practical circuit of the functional circuit 120A and the counting circuit 120B. Other reasonable structures are also within the scope of embodiment.

In summary, a plurality of sets of capacitors of a controllable capacitance array may be sorted and calibrated according to capacitance by performing the foresaid steps repeatedly. Matching capacitance may be adjusted and compensated according to an operation frequency of an antenna. Errors caused by circuit layout and/or manufacture process may be reduced, and the adjusted capacitance may be closer to a required frequency. In addition, by means of methods and devices provided by embodiments, extra workload caused by repeated measurements, and the inaccuracy caused by interpolation may be avoided. Hence, solutions provided by embodiments are helpful in the field.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A capacitance adjustment method used to enable or disable a first set of capacitors to an $n_{th}$ set of capacitors of n sets of capacitors, comprising:
    generating a base count according to base capacitance;
    generating a first count to an $n_{th}$ count according to the first set of capacitors to the $n_{th}$ set of capacitors respectively;
    obtaining a first ratio to an $n_{th}$ ratio according to the base count and the first count to the $n_{th}$ count;
    indicating a target count;
    obtaining a target ratio according to the base count and the target count; and
    obtaining a first control signal to an $n_{th}$ control signal according to the target ratio and the first ratio to the $n_{th}$ ratio to enable or disable the first set of capacitors to the $n_{th}$ set of capacitors accordingly;
    wherein n is a positive integer larger than zero.

2. The method of claim 1, wherein:
    generating the base count according to the base capacitance comprises:
        generating a base count signal according to the base capacitance; and
        generating the base count according to the base count signal; and
    generating the first count to the $n_{th}$ count according to the first set of capacitors to the $n_{th}$ set of capacitors respectively comprises:
        enabling the first set of capacitors to the $n_{th}$ set of capacitors respectively to generate a first count signal to an $n_{th}$ count signal; and
        generating the first count to the $n_{th}$ count according to the first count signal to the $n_{th}$ count signal respectively.

3. The method of claim 1, further comprising:
    generating n count signals according to capacitances of the n sets of capacitors for generating n counts;
    sorting the n counts to obtain a first count to an $n_{th}$ count; and
    sorting the n sets of capacitors to obtain a sequence of the first set of capacitors to the $n_{th}$ set of capacitors according to a sequence of the a first count to the $n_{th}$ count;
    wherein capacitance of an $i_{th}$ set of capacitors is smaller than capacitance of an $(i+1)_{th}$ set of capacitors, n>i>0 and i is an integer.

4. The method of claim 1, wherein the base capacitance is parasitic capacitance when the n sets of capacitors are all disabled.

5. The method of claim 1, wherein the obtaining the first control signal to the $n_{th}$ control signal according to the target ratio and the first ratio to the $n_{th}$ ratio comprises:
    setting a residual parameter;

when the residual parameter is larger than or equal to a reciprocal of an $x_{th}$ ratio of the first ratio to the $n_{th}$ ratio, subtracting the reciprocal of the $x_{th}$ ratio from the residual parameter to update the residual parameter, and setting an $x_{th}$ control signal of the first control signal to the $n_{th}$ control signal to an enabling level; and when the residual parameter is larger than or equal to a reciprocal of an $(x-1)_{th}$ ratio of the first ratio to the $n_{th}$ ratio, subtracting the reciprocal of the $(x-1)_{th}$ ratio from the residual parameter to update the residual parameter, and setting an $(x-1)_{th}$ control signal of the first control signal to the $n_{th}$ control signal to the enabling level;

wherein an initial value of the residual parameter is equal to a reciprocal of the target ratio, x is an integer, and $n \geq x \geq 2$.

6. The method of claim 5, wherein the obtaining the first control signal to the $n_{th}$ control signal according to the target ratio and the first ratio to the $n_{th}$ ratio further comprises:

when the residual parameter is larger than or equal to a product of a reciprocal of the first ratio and an adjustment parameter, setting the first control signal to an enabling level.

7. The method of claim 1, wherein the obtaining the first control signal to the $n_{th}$ control signal according to the target ratio and the first ratio to the $n_{th}$ ratio comprises:

setting a residual parameter;

when the residual parameter is less than a reciprocal of an $x_{th}$ ratio of the first ratio to the $n_{th}$ ratio, setting an $x_{th}$ control signal of the first control signal to the $n_{th}$ control signal to a disabling level; and when the residual parameter is larger than or equal to a reciprocal of an $(x-1)_{th}$ ratio of the first ratio to the $n_{th}$ ratio, subtracting the reciprocal of the $(x-1)_{th}$ ratio from the residual parameter to update the residual parameter, and setting an $(x-1)_{th}$ control signal of the first control signal to the $n_{th}$ control signal to an enabling level;

wherein an initial value of the residual parameter is equal to a reciprocal of the target ratio, x is an integer, and $n \geq x \geq 2$.

8. The method of claim 7, wherein the obtaining the first control signal to the $n_{th}$ control signal according to the target ratio and the first ratio to the $n_{th}$ ratio further comprises:

when the residual parameter is larger than or equal to a product of a reciprocal of the first ratio and an adjustment parameter, setting the first control signal to an enabling level.

9. The method of claim 1, wherein the obtaining the first control signal to the $n_{th}$ control signal according to the target ratio and the first ratio to the $n_{th}$ ratio comprises:

setting a residual parameter;

when the residual parameter is less than a reciprocal of an $x_{th}$ ratio of the first ratio to the $n_{th}$ ratio, setting an $x_{th}$ control signal of the first control signal to the $n_{th}$ control signal to a disabling level; and when the residual parameter is less than a reciprocal of an $(x-1)_{th}$ ratio of the first ratio to the $n_{th}$ ratio, setting an $(x-1)_{th}$ control signal of the first control signal to the $n_{th}$ control signal to the disabling level;

wherein an initial value of the residual parameter is equal to a reciprocal of the target ratio, x is an integer, and $n \geq x \geq 2$.

10. The method of claim 9, wherein the obtaining the first control signal to the $n_{th}$ control signal according to the target ratio and the first ratio to the $n_{th}$ ratio further comprises:

when the residual parameter is larger than or equal to a product of a reciprocal of the first ratio and an adjustment parameter, setting the first control signal to an enabling level.

11. The method of claim 1, wherein the obtaining the first control signal to the $n_{th}$ control signal according to the target ratio and the first ratio to the $n_{th}$ ratio comprises:

setting a residual parameter;

when the residual parameter is larger than or equal to a reciprocal of an $x_{th}$ ratio of the first ratio to the $n_{th}$ ratio, subtracting the reciprocal of the $x_{th}$ ratio from the residual parameter to update the residual parameter, and setting an $x_{th}$ control signal of the first control signal to the $n_{th}$ control signal to an enabling level; and when the residual parameter is less than a reciprocal of an $(x-1)_{th}$ ratio of the first ratio to the $n_{th}$ ratio, setting an $(x-1)_{th}$ control signal of the first control signal to the $n_{th}$ control signal to a disabling level;

wherein an initial value of the residual parameter is equal to a reciprocal of the target ratio, x is an integer, and $n \geq x \geq 2$.

12. The method of claim 11, wherein the obtaining the first control signal to the $n_{th}$ control signal according to the target ratio and the first ratio to the $n_{th}$ ratio further comprises:

when the residual parameter is larger than or equal to a product of a reciprocal of the first ratio and an adjustment parameter, setting the first control signal to an enabling level.

13. The method of claim 1, wherein the first set of capacitors to the $n_{th}$ set of capacitors are enabled or disabled by using an $m_{th}$ control signal of the first control signal to the $n_{th}$ control signal to enable or disable an $m_{th}$ switch being coupled to an $m_{th}$ set of capacitors of the first set of capacitors to the $n_{th}$ set of capacitors, wherein m is an integer, and $n \geq m \geq 1$.

14. A capacitance adjustment device comprising:

a controllable capacitance array configured to generate equivalent capacitance according to a set of control signals, the controllable capacitance array comprising a set of control terminals configured to receive the set of control signals, a first terminal, and n sets of capacitors, wherein the controllable capacitance array is further configured to enable or disable a first set of capacitors to an $n_{th}$ set of capacitors of the n sets of capacitors;

a count generation circuit configured to generate a count according to the equivalent capacitance of the controllable capacitance array, the count generation circuit comprising an input terminal coupled to the first terminal of the controllable capacitance array, and at least one output terminal configured to output the count, wherein the count generation circuit is further configured to generate a base count according to base capacitance and generate a first count to an $n_{th}$ count according to the first set of capacitors to the $n_{th}$ set of capacitors respectively; and a processing unit configured to generate the set of control signals according to the count, the processing unit comprising at least one input terminal coupled to the at least one output terminal of the count generation circuit and configured to receive the count, and a set of output terminals coupled to the set of control terminals of the controllable capacitance array and configured to output the set of control signals, wherein the processing unit is further configured to obtain a first ratio to an $n_{th}$ ratio according to the base count and the first count to the $n_{th}$ count, indicate a target count, obtain a target ratio according to the base count and the target count, and obtain a first control signal to an $n_{th}$ control signal according to the target ratio and the first ratio to the $n_{th}$ ratio to enable or disable the first set of capacitors to the $n_{th}$ set of capacitors accordingly, and n is a positive integer larger than zero.

15. The capacitance adjustment device of claim 14, wherein the count generation circuit further comprises:
   a functional circuit configured to generate a count signal and comprising an input terminal coupled to the input terminal of the count generation circuit, and an output terminal configured to output the count signal; and
   a counting circuit configured to generate the count and comprising an input terminal coupled to the output terminal of the functional circuit and configured to receive the count signal, and at least one output terminal correspondingly coupled to the at least one output terminal of the count generation circuit.

16. The capacitance adjustment device of claim 14, wherein:
   generating the base count according to the base capacitance comprises:
      generating a base count signal according to the base capacitance; and
      generating the base count according to the base count signal; and
   generating the first count to the $n_{th}$ count according to the first set of capacitors to the $n_{th}$ set of capacitors respectively comprises:
      enabling the first set of capacitors to the $n_{th}$ set of capacitors respectively to generate a first count signal to an $n_{th}$ count signal; and
      generating the first count to the $n_{th}$ count according to the first count signal to the $n_{th}$ count signal respectively.

17. The capacitance adjustment device of claim 14, wherein:
   generating n count signals according to capacitances of the n sets of capacitors for generating n counts;
   sorting the n counts to obtain a first count to an $n_{th}$ count; and
   sorting the n sets of capacitors to obtain a sequence of the first set of capacitors to the $n_{th}$ set of capacitors according to a sequence of the a first count to the $n_{th}$ count;
   wherein capacitance of an $i_{th}$ set of capacitors is smaller than capacitance of an $(i+1)_{th}$ set of capacitors, $n>i>0$ and i is an integer.

18. The capacitance adjustment device of claim 14, wherein the base capacitance is parasitic capacitance when the n sets of capacitors are all disabled.

19. The capacitance adjustment device of 14, wherein the first set of capacitors to the $n_{th}$ set of capacitors are enabled or disabled by using an $m_{th}$ control signal of the first control signal to the $n_{th}$ control signal to enable or disable an $m_{th}$ switch being coupled to an $m_{th}$ set of capacitors of the first set of capacitors to the $n_{th}$ set of capacitors, wherein m is an integer, and $n \geq m \geq 1$.

* * * * *